United States Patent [19]

Nakai et al.

[11] Patent Number: 4,663,535

[45] Date of Patent: May 5, 1987

[54] COLOR IMAGE SENSOR

[75] Inventors: Toshio Nakai; Tamio Saito, both of Tokyo, Japan

[73] Assignee: Kabushiki Kaisha Toshiba, Kawasaki, Japan

[21] Appl. No.: 736,860

[22] Filed: May 22, 1985

[30] Foreign Application Priority Data

Aug. 22, 1984 [JP] Japan .................. 59-174386

[51] Int. Cl.$^4$ ................ H04N 3/12; H01L 29/78; H01L 27/14
[52] U.S. Cl. ................ 250/578; 358/213.29; 357/24; 357/30
[58] Field of Search ............ 358/212, 213; 250/578; 355/38; 357/24 LR, 30, 31, 32

[56] References Cited

U.S. PATENT DOCUMENTS

| | | | |
|---|---|---|---|
| 4,242,694 | 12/1980 | Koike et al. | 357/24 |
| 4,387,987 | 6/1983 | Koike et al. | 357/31 |
| 4,542,409 | 9/1985 | Ochi | 358/212 |
| 4,543,489 | 9/1985 | Harada et al. | 250/578 |
| 4,558,365 | 12/1985 | Ochi | 358/212 |

FOREIGN PATENT DOCUMENTS

| | | | |
|---|---|---|---|
| 0048954 | 3/1984 | Japan | 357/30 |
| 0227157 | 12/1984 | Japan | 357/32 |
| 0017951 | 1/1985 | Japan | 357/32 |

Primary Examiner—Edward P. Westin
Assistant Examiner—Charles Wieland
Attorney, Agent, or Firm—Oblon, Fisher, Spivak, McClelland & Maier

[57] ABSTRACT

A contact type color image sensor reads out a document image at its actual size while moving along the length of the document. The photosensitive cell arrays, each having pixel electrodes which prescribe n photosensitive cells (where n is a positive integer), are aligned on the substrate. Filter films are positioned over the cell arrays. The radiated image light is converted into the three primary color components of red, green and blue, and R, G, B color signals necessary for color reproduction of the document image are obtained from the respective cell arrays. The n photosensitive cells are arranged at a predetermined pitch p along the main scanning direction X in each array, and the cell arrays are arranged at a sub-scanning direction pitch q which is larger than the pitch p by a factor of K (where k is larger than 1 and k×n is a natural number).

13 Claims, 11 Drawing Figures

COLOR IMAGE SENSOR

BACKGROUND OF THE INVENTION

The present invention relates generally to a contact type image sensor, and, more particularly, to a contact type color image sensor formed using amorphous semiconductor film.

In general, when the document image to be transmitted is read in a facsimile system, that optical image is focused onto the photoelectric converting unit. This photoelectric converting unit is formed of a small solid-state CCD imaging device of 2048 bits and approximately 32 to 46 mm long. A lens is used to focus the image of the document on the photosensitive surface of this small CCD image sensor and to reduce the image size. A typical A4 document 200 mm wide must be reduced to 32–46 mm. In order to obtain this degree of reduction the distance from the document to the image sensor must be increased, which makes it difficult to build a compact facsimile terminal.

In consideration of this problem, contact type image sensors have been developed. With this kind of sensor, the length of the sensor array is substantially the same as the width of the document, which means that image reduction before the image reaches the image sensor is not necessary. With this kind of construction, the length of the optical path from the document surface to the photoelectric converting unit can be decreased to around 10 mm because a real-size (1:1 magnification) optical system, such as a rod lens array is used for forming the image.

The demand for a color facsimile system has increased the need for development in contact type linear image sensors. One problem is that if the sensor is made to provide color images, the signal-to-noise ratio (S/N ratio) of the image reading will decrease. The reason for this decrease is that color separation of the input optical image is carried out in the lengthwise direction of the linear CCD image sensor, i.e., the main scanning direction. Consequently, the number of picture elements (pixels) in the main scanning direction is reduced to the equivalent of one third.

In order to solve this problem, the inventors have proposed arranging a plurality of cells for sensing the three primary colors of one pixel in the width direction of the contact type image sensor (Japanese Patent Application No. 58-220972). With this improvement in the arrangement of the cells, the color separation is carried out in the sub-scanning direction of the contact type image sensor, so it is possible to prevent a reduction in the S/N ratio. The result of this is that the color image sensor is improved to have the same S/N ratio as a monochrome sensor to which a color filter has been attached.

In the embodiment of the above concept, when the pixel electrodes of the contact type image sensor are arranged contiguously along the sub-scanning direction, they must be made smaller than the pixel electrodes in the main scanning direction. Consequently, the photosensitive area is reduced by the amount of the decrease in size of the electrodes in the sub-scanning direction. This decrease in photosensitive area brings with it (1) a lower S/N ratio and (2) great difficulty in positioning of the sensor in relation to the pixels of the color filter, making mounting on the sensor difficult.

SUMMARY OF THE INVENTION

It is therefore an object of the present invention to provide a new and improved contact type color image sensor which has an improved output level of effective image components when reading the color image, and which is easy to mount on the image sensor of the color filter.

In the document image read-out mode, the contact type color image sensor of the invention reads out an image which is the actual size of the document while moving in the lengthwise direction of the document. This color image sensor comprises photosensitive cell arrays aligned on a substrate and each having n photosensitive cells (n being a positive integer). A filter section is positioned on top of the photosensitive arrays, and receives the input image light, filters this image light and radiates the light components of the special basic colors onto the photosensitive cell arrays.

The three primary color signals (R, G, B signals) necessary for the reproduction of the color document are output from each of the photosensitive arrays. The pitch of the cell arrays on the substrate is k times wider than the pitch of the n photosensitive cells in each cell array. (The value k is larger than 1 and k·n is a natural number.)

BRIEF DESCRIPTION OF THE DRAWINGS

The present invention can best be understood by reference to the accompanying drawings, in which.

DETAILED DESCRIPTION OF THE PREFERRED EMBODIMENTS

Figure 1:
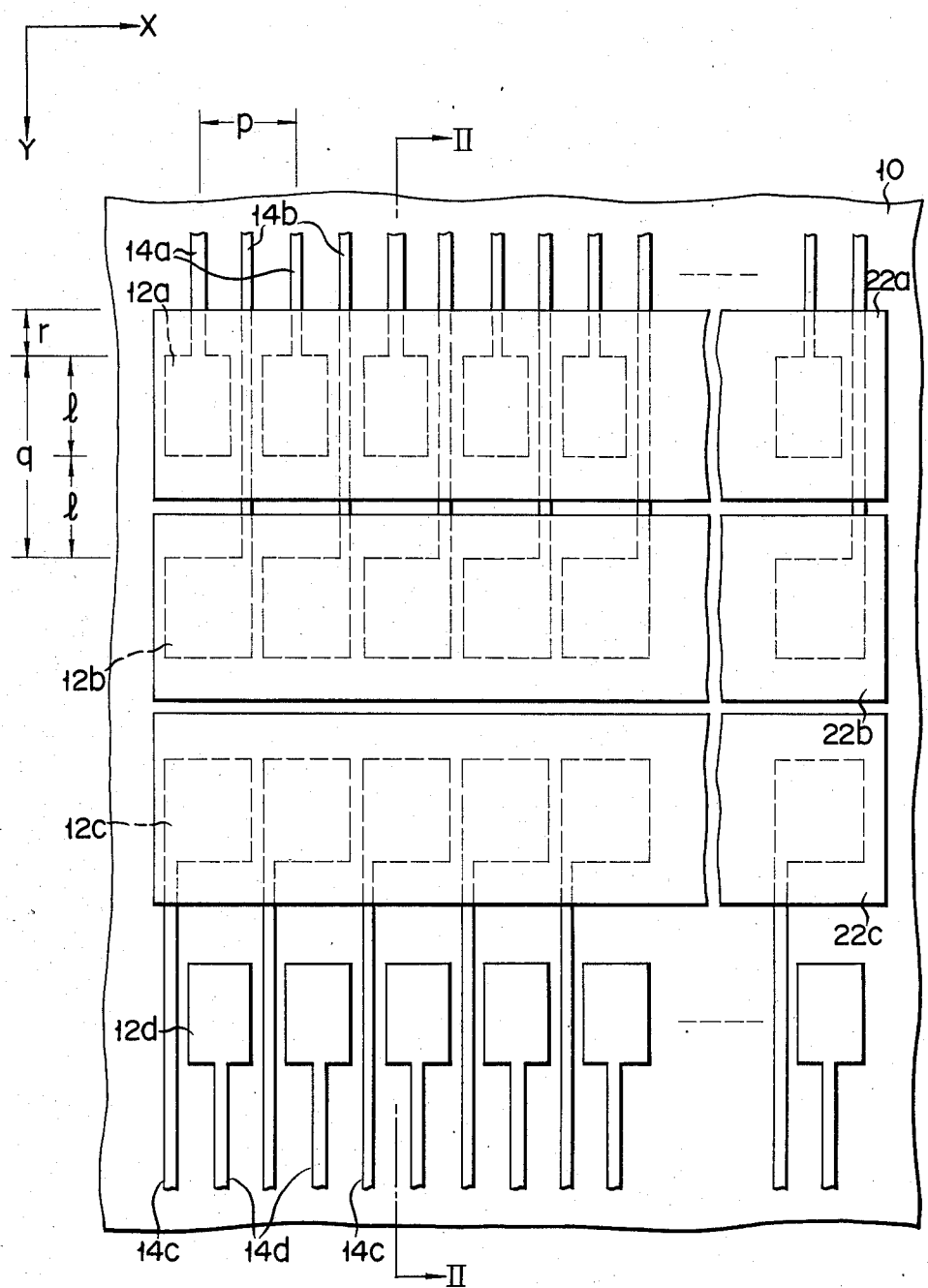
FIG. 1 is a plan view of the main components of the contact color image sensor according to the preferred embodiment.

In a contact type color image sensor according to one embodiment of this invention shown in FIG. 1, an insulative substrate 10 is formed of a glass substrate or a ceramic substrate on the surface of which a glazed layer has been formed. Four columns of pixel electrode arrays 12a to 12d, each defining one photosensing cell, are arranged on substrate 10. One pixel array is formed of n pixel electrodes linearly arranged across the length which corresponds to the width of the whole document. These pixel electrodes have the same construction and are 4n in number. Signal read-out electrodes 14a–14d extend in the sub-scanning direction Y from the four columns of pixel electrodes 12a–12d. These read-out electrodes are 4n in number and are connected to the pixel electrodes.

Signal read-out electrodes 14a and 14d in the sub-scanning direction Y are connected to pixel electrode arrays 12a and 12d, which are positioned on either sides of substrate 10, and extend in mutually opposite directions. The planar pattern of the pixel electrode of pixel electrode arrays 12a and 12d is narrower than that of the pixel electrode in arrays 12b and 12c remaining in the center of substrate 10. Consequently, the space between the two neighbouring pixel electrodes is increased. Signal read-out electrodes 14b and 14c, which are connected to the center pixel electrode arrays 12b and 12c, and which pass through the spaces between the pixel electrodes included in pixel electrode arrays 12a and 12d, extend in opposite directions along the secondary scanning direction. Material for pixel electrodes 14 may be selected from any one or more of a group composed of chromium (Cr), tantalum (Ta), tungsten (W), titanium (Ti), aluminum (Al), vanadium (V), nickel (Ni), copper (Cu), platinum (Pt), gold (Au).

Figure 2:
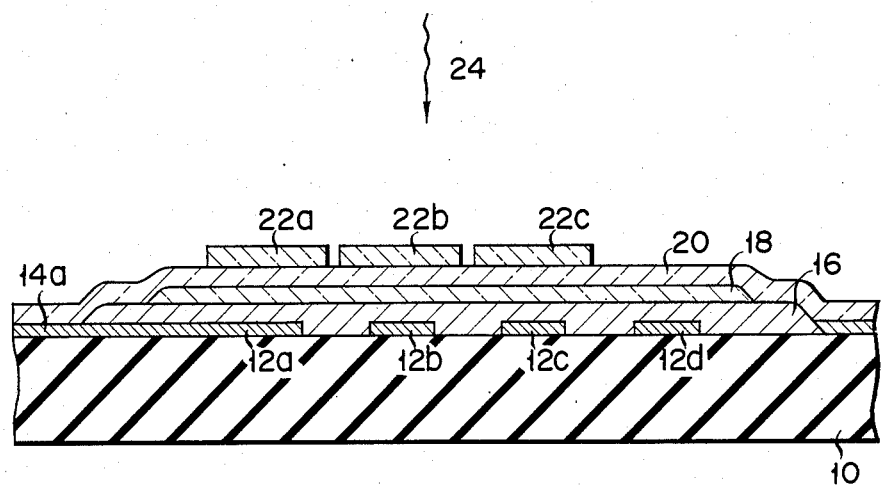
FIG. 2 is a cross section of the color image sensor along the line II—II.
Figure 4:
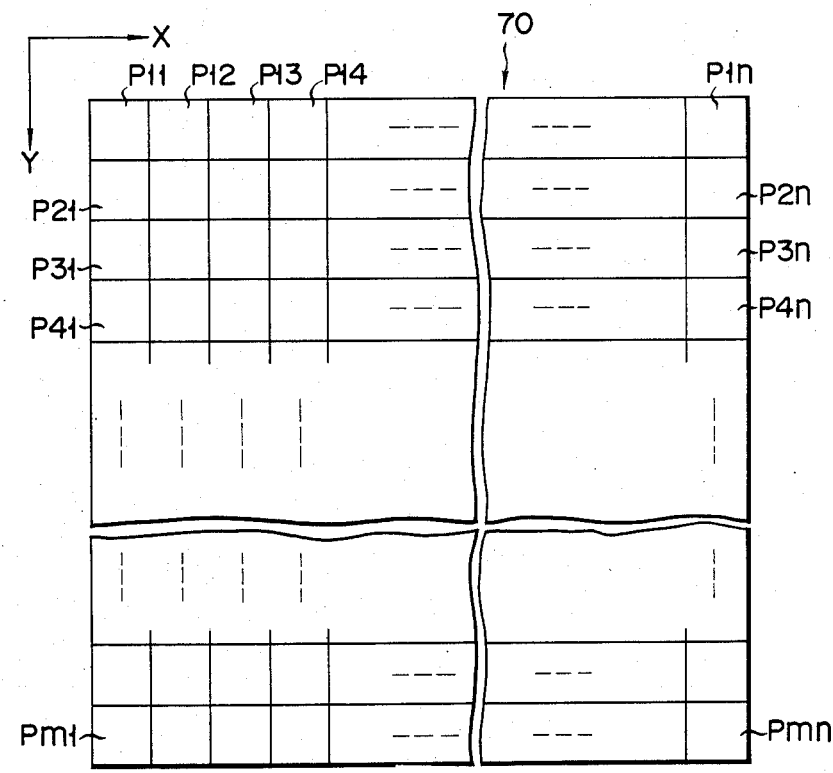
FIG. 4 is a plan view of the paper document to be read.

FIG. 2 is a cross section along line II—II of the contact type image sensor of FIG. 1. Substrate 10, on which pixel electrodes 12 are formed, has an amorphous semiconductor layer 16 deposited over the entire surface. In order to function as a photoelectric converting layer 16 is formed of amorphous semiconductor material such as silicon, silicon carbon, or silicon germanium. This amorphous semiconductor material is a compound or a mixture including hydrogen (H) and fluorine (F). Boron (B), phosphorous (P), nitrogen (N) or oxygen (O), etc. may be doped on layer 16 as required. The layer region in which layer 16 and each pixel electrode 12 contact corresponds to photoelectric converting element region P (pixel region) of the image sensor.

A transparent, conductive layer 18 made of indium-tin-oxide (ITO) is formed on amorphous silicon layer 16 to serve as a common electrode. Transparent, common electrode 18 functions as a barrier layer against electrons or holes entering layer 16. Transparent protective layer 20 is provided on ITO layer 18. This layer, though not always necessary, is for protecting amorphous semiconductor layer 16 and common electrode 18, and is formed of an organic material such as polyparaxylylene or polyimide, or inorganic material such as silicon oxide ($SiO_2$), aluminum oxide ($Al_2O_3$), tantalum oxide ($Ta_2O_5$) or silicon nitrogen ($SiN_x$).

Color filter films 22a, 22b, 22c are provided on protective layer 20 and respectively cover the three columns of pixel electrode arrays 12a, 12b, 12c. One color filter film covers n underlaying pixel electrodes. These filters are transparent only to the red, green and blue color components of color optical image 24, which is radiated on the image sensor, and are consequently referred to as R pass filter, G pass filter and B pass filter. As a result of these filters, pixel electrode array 12a is photosensitive to red light, array 12b is photosensitive to green light, and array 12c is photosensitive to blue light. No filter is provided on the fourth pixel electrode array 12d so it is photosensitive to all light, i.e., white light.

In this embodiment, the outside pixel electrode array 12a, which is smaller in area than the other pixel areas of each pixel electrode, is covered by R pass filter 22a. This arrangement provides a uniform output from the image sensor of the three color components because the transmission rates of the red pass filters is greater than the transmission rate of the green or blue pass filter, and this difference in transmission rates compensates for the difference in pixel area.

Careful attention should be directed to the following important feature. With the contact type image sensor of the first embodiment of this invention, when "p" indicates the pixel pitch in the main scanning direction X, the pixel pitch q in the sub-scanning directionis set by k, which is the number of times that p is multiplied. (i.e., $q = p \cdot k$). The value of k·n is a natural number larger than 1. According to this embodiment, when for example, the number n of pixels included in one pixel array 12a, 12b or 12c is set at 100, parameter k, which determines the pixel pitch q in the sub-scanning direction Y, can be selected from the series, 1.01, 1.02, ... 1.98, 1.99, 2, 2.01 .... For example, in this embodiment k is taken to equal 2 so pixel pitch q in the sub-scanning direction Y is 2·p. The length l of the pixel electrodes in the sub-scanning direction Y is equal to pitch q in this scanning direction Y so the gaps between the pixel electrodes of the two adjacent pixel electrode arrays (12a and 12b, or 12b and 12c) along the sub-scanning direction Y also have a length equal to l in the sub-scanning direction of the pixel electrodes. Namely, the length l of the gaps between the pixel electrodes of the two adjacent pixel electrode arrays (12a and 12b, or 12b and 12c) along the sub-scanning direction Y expands to become equal to any length of the pixel electrode in the secondary scanning direction.

Figure 3:
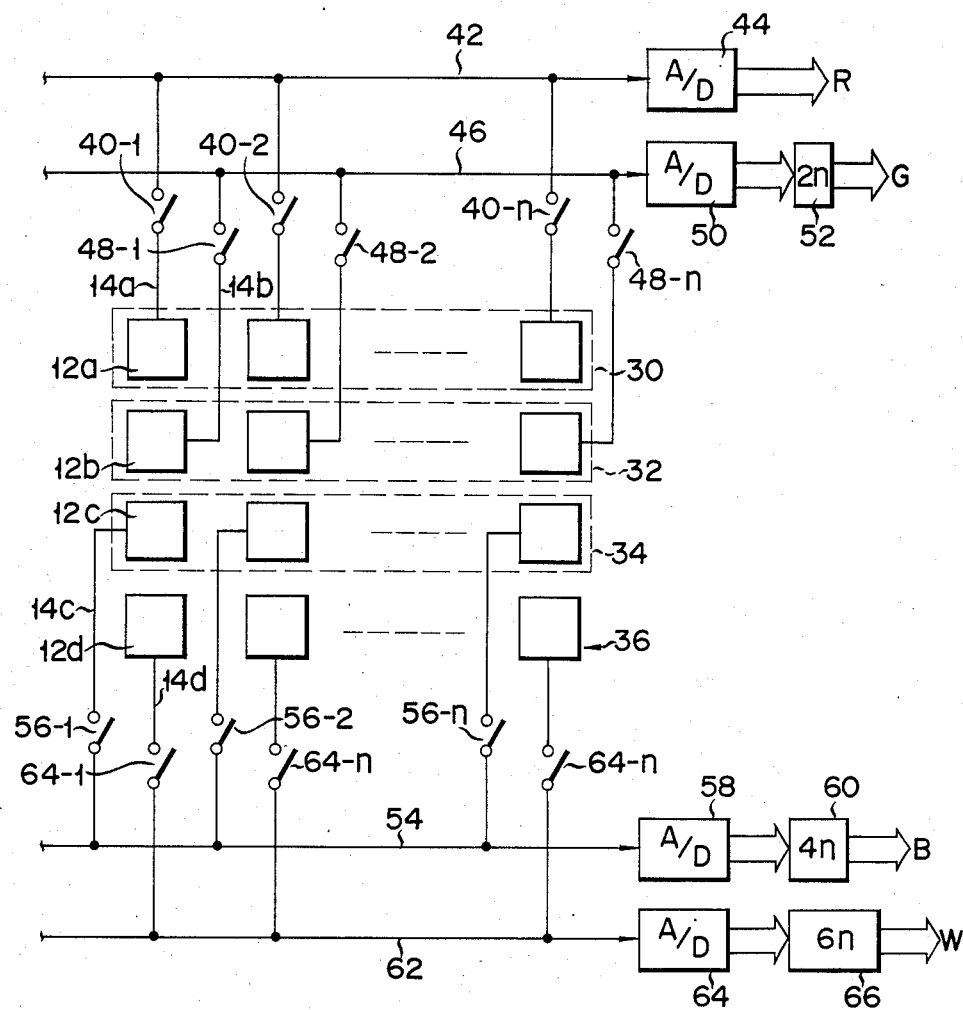
FIG. 3 is a circuit diagram of the document read-out device, which includes the color image sensor of FIG. 1.

In FIG. 3, pixel electrode array 12a, which is photosensitive to only red light, is referred to as R pixel area 30 because of the effect of R pass filter 22a, and array 12b becomes G pixel area 32 and array 12c becomes B pixel area 34 due to the effect of the respective filters 22b and 22c. Pixel electrode array 12d on which no filter is provided is referred to as W pixel area 36.

Pixel electrodes 12a, which are in R pixel area 30, are connected to common signal output lines 40-1, 40-2, ..., 40-n by way of switches 42. Common signal output lines 40 are connected to analog/digital converter circuit 44. The pixel electrodes 12b included in G pixel area 32 are connected to common signal output line 46 via switches 48-1, 48-2, ..., 48-n, and line 46 is connected to A/D converter circuit 50 and 2n long delay register 52. The pixel electrodes 12c included in B pixel area 34 are connected to common signal output line 54 via switches 56-1, 56-2, ..., 56-n, and line 54 is connected to A/D converter circuit 58 and 4n long delay register 60. The pixel electrodes 12d included in W pixel area 36 are connected to common signal output line 62 via switches 64-1, 64-2, ..., 64-n, and line 62 is connected to A/D converter circuit 64 and 6n long delay register 66.

The operation mode of this embodiment will now be described. The width of document 70 to be read by the facsimile system corresponds to the total length of the contact type image sensor so it is divided into n unit image areas (or document images) along the direction X, corresponding to the number (n) of pixel electrodes included in each pixel electrode array 12 of the sensor. If the length of document 70 (corresponding to the subscanning direction Y) is divided into m unit image areas (m is a positive integer), the total reading area of document 70 will be n×m unit image areas.

In the document read mode, when W pixel area 36 of the sensor is positioned corresponding to the first line of the unit images (P11, P12, ..., P1n) of document 70, switches 64 sequentially become conductive, 64-1, 64-2, ..., 64-n. The brightness data of the unit image areas P11, P12, ..., P1n sequentially appears on common output line 62 as electric signals. These brightness signals are converted to digital signals by A/D converter 64 and stored in the first of the n stages of delay register 66.

When the contact type image sensor is moved in the sub-scanning direction Y and B pixel area 34 is positioned at a certain position corresponding to the first line of the document 70 including unit images P11, P12, ..., P1n switches 56-1, 56-2, ..., 56-n are driven to sequentially become conductive, resulting that blue color data of the unit images P11, P12, ..., P1n sequentially appear on the common output line 54 as electrical blue color signals. These B color signals are converted to digital signals by A/D converter 58 and then stored in n-th to 1st stage registers of delay register 60.

When the contact type image sensor is further moved in the sub-scanning direction Y and G pixel area 32 is positioned corresponding to the aforementioned first line including unit images P11, P12, ..., P1n, switches 48-1, 48-2, ... 48-n sequentially rendered conductive, resulting that electrical signals representing green color data of these unit images P11, P12, ..., P1n sequentially appear on the common output line 46. These G color signals are converted to digital signals by A/D converter 50 and stored in n-th to 1st stage registers of delay register 52.

When the sensor is further moved in the subscanning direction to cause the R pixel region 30 to be positioned corresponding to the first line of unit images P11, P12, ..., P1n, switches 40-1, 40-2, ..., 40-n sequentially become conductive, resulting in the red color data of the unit images P11, P12, ..., P1n sequentially appearing on the line 42 as electrical signals. These R color signals are converted to digital signals by A/D converter 44.

Delay registers 66, 60, 52 transmit signals synchronous with the same clock signal so when the red color signal of the unit images P11, P12, ..., P1n in the first line of document 70 is sequentially output, the green, blue and brightness signals of the same unit image P11, P12, ... P1n are obtained from the three delay registers 52, 60, 66 synchronous with the output timing of the red signal. The read operation of the pixel areas in the other direction of the document is substantially the same as the above.

The red, green, blue and the brightness signal obtained with respect to the whole image area of the document are compensated by the matrix circuit (not shown) if the final output signal requires it. When cyan, magenta and yellow signals are required, the three filters 22 of FIG. 1 may be changed to transmit that particular light.

The red, green and blue cells necessary to obtain the color image signal of the unit image or picture element P are arranged in the width direction of the image sensor, or sub-scanning direction Y so the image resolution in the main scanning direction X is substantially the same as that of a monochrome image sensor. The size of the pixel electrodes in the main scanning direction can be improved to be made the same as that of a monochrome image sensor. The size of the pixel electrodes in the sub-scanning direction is, at the maximum, equal to the length in the sub-scanning direction of the pixel to be read so the area of each pixel electrode can be increased to the maximum and the S/N ratio of the color reproduction output signal can be improved.

The pixel arrangement pitch q in the sub-scanning direction y between R, G, B and W pixel series 30, 32, 34, 36 is set larger than pixel pitch p of the main scanning direction X, as is shown by $q = k \cdot p$. Where, the number k is carefully selected to be a specific parameter which is larger than 1 and allows the resultant product $k \cdot n$ to become a natural number. The feature that pixel pitch q becomes larger than pitch p by the multiple k is extremely important and provides the following effect.

(1) By using k, which satisfies the above conditions, there is no upset during the signal delay processing carried out by delay registers 52, 60, 66 of FIG. 3 in the simultaneousness of the signals, and, accordingly, the output timing of the R, G, B and brightness signals can be set accurately.

(2) Because the pitch q between adjacent cell arrays 30, 32, 34, 36 is large, each color pass filter 22a, 22b, 22c can be accurately positioned on the contact type image sensor and easily assembled.

The result of this is that the output level of the effective image components is increased for reading and the assembly of the filters on the image sensor is easy to perform.

Furthermore, it should be noted that in the above embodiment the signal delay occurring at the delay register 52, 60, 66 increases in order 2n, 4n, 6n. With this kind of setting, pitch q is twice the size of pitch p. In general, when pitch q is set larger than pitch p by multiple k ($k \cdot n$ = natural number), the signal delay process at the delay register 52, 60, 66 is sequentially increased by k times. Consequently, the read-out timing misalignment of the R, G, B, W signals (these are read from cell arrays 30, 32, 34, 36, respectively) of one unit image (such as $P_{11}$) can be accurately compensated.

Figure 5:
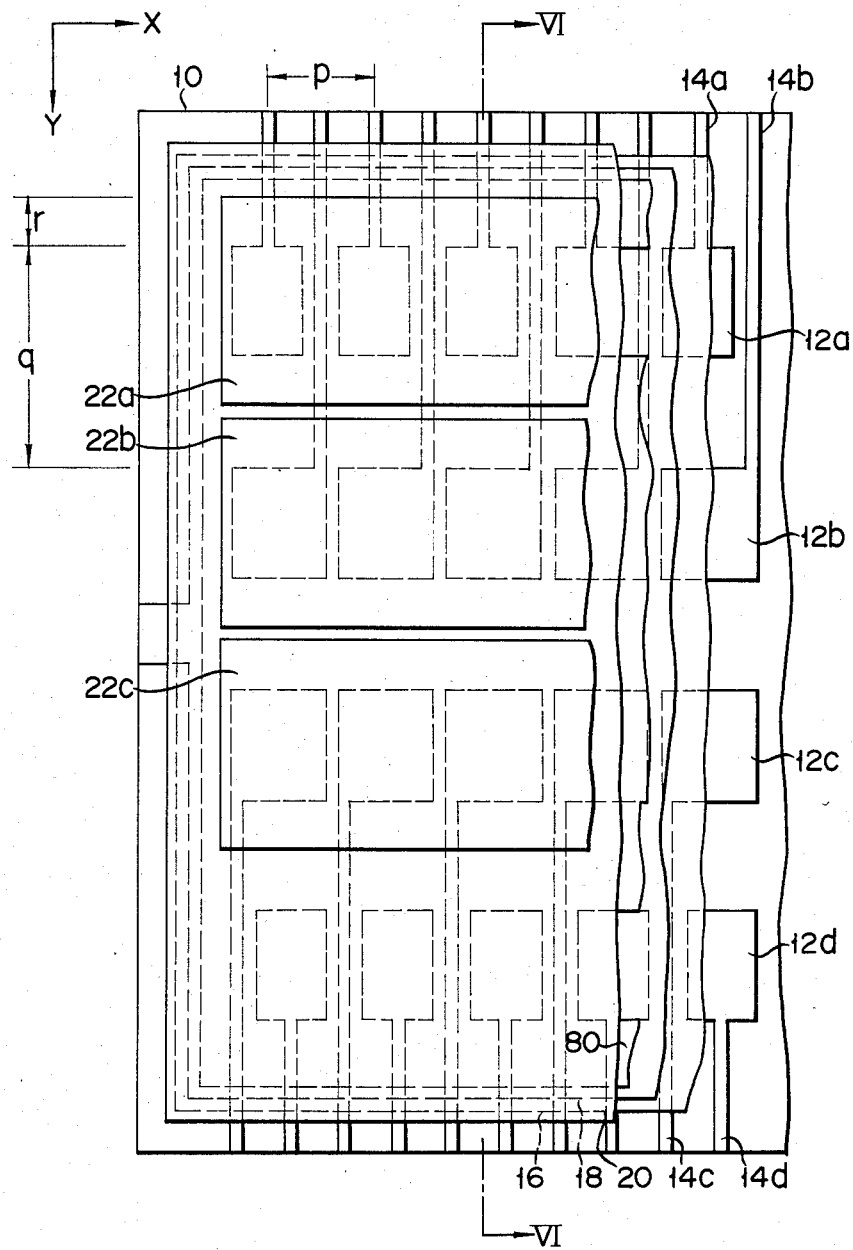
FIG. 5 is a plan view of the main parts of the contact type color image sensor according to the second embodiment.

FIG. 5 is a plan view of the main elements of the contact type color image sensor according to the second embodiment of this invention. The same reference numbers have been used for parts corresponding to those shown in FIG. 1, and description of which has been omitted.

Figure 6:
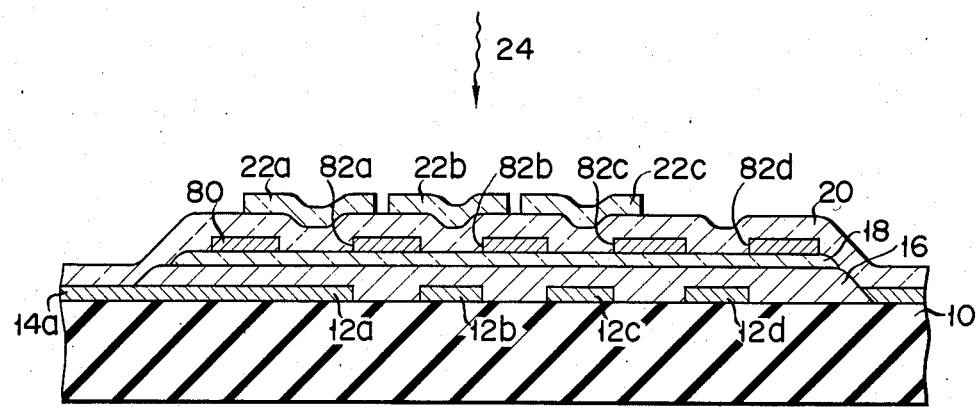
FIG. 6 is a cross section along line VI—VI of the image sensor of FIG. 5.
Figure 7:
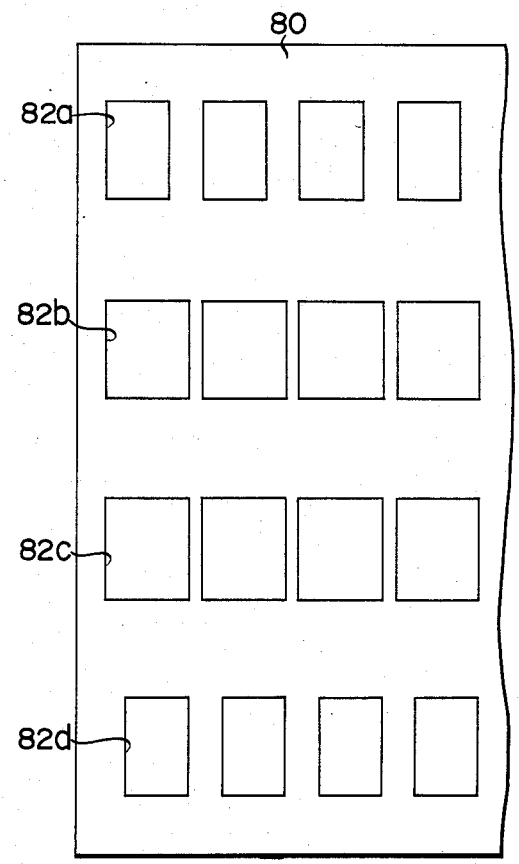
FIG. 7 is a plan view of the light interrupting film attached to the sensor of FIG. 5.

Light shield film 80 is added onto common, transparent electrode layer 18 of the color image sensor. This light shield film is made of electrically conductive and opaque material, such as chromium or titanium. Film 80 has flat openings 82a, 82b, 82c, 82d, which have the same shape as the underlying pixel electrodes 12a, 12b, 12c, 12d. The positional relationship of openings 82 and electrodes 12 can be readily understood from the cross section shown in FIG. 6. The planar shape of light shield film 80 is also illustrated in FIG. 6. The area of each pixel electrode of the two pixel arrays 12a and 12d on the outer sides is smaller than that of the electrodes of the center pixel arrays 12b and 12c, so openings 82a and 82d are also correspondingly smaller.

With the addition of light shield layer 80 radiation of light is prevented on regions other than the cells (e.g., regions where signal electrode patterns 14 are formed on amorphous semiconductor layer 16, which is formed on substrate 10 such that pixel electrodes 12 are buried. Also, with the addition of film 80 it is possible to improve the conductance of common, transparent electrode 18. Namely, in order to increase the light transmissivity of this electrode, which forms the ITO, the thickness is decreased, which increases the relative resistance (e.g., 1/1000 ohm/cm). The result of this is that the voltage drop of electrode layer 18 becomes conspicuous. However, by coating a chromium of titanium film 80 on ITO electrode layer 18, it is possible to reduce the relative resistance of transparent electrode 18, preventing a voltage drop.

Figure 8:
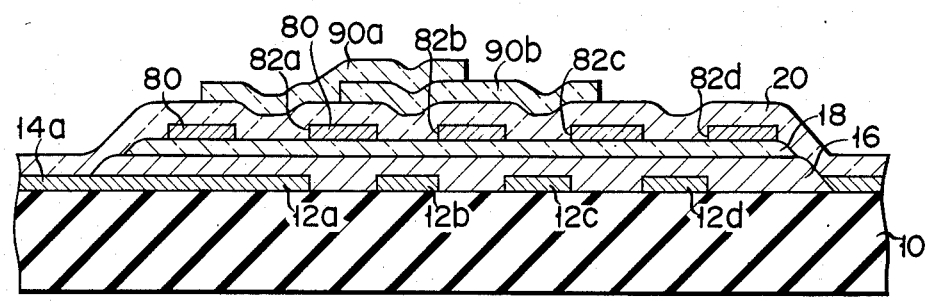
FIGS. 8 and 9 are cross sections of variations on the contact type color image sensor of this invention.
Figure 9:
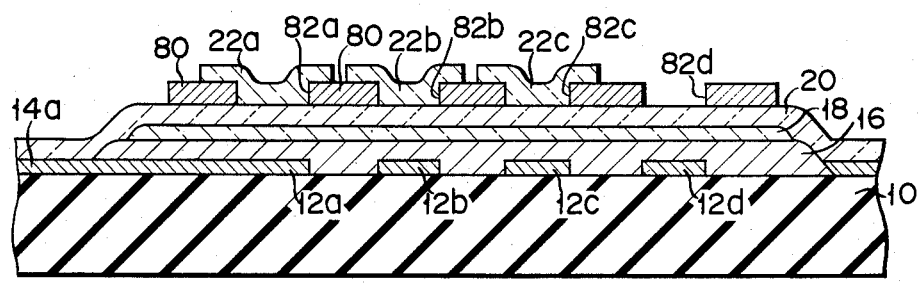

FIGS. 8 and 9 show a variation in the formation of the color filter layers (corresponding to filters 22 of FIGS. 1, 2, 5 or 6) and the light shield film (80). In the variation shown in FIG. 8, two color filters 90a and 90b are formed on transparent protective layer 20 such that they partially overlap. The one color filter 90a is a yellow pass filter (Y-filter), and covers the top of cell arrays 12a and 12b. The other color filter 90b is a cyan pass filter (Cy-filter), and covers the top of cell arrays 12b and 12c. The document image light radiated onto cell array 12b passes through the two layers of Y-filter 90a and Cy-filter 90b converting it into green light. Accordingly, the overlapping portion of Y-filter 90a and Cy-filter 90b functions as a green pass filter (G-filter). In this case, the Cy-filter and G-filter have a lower degree of light transmissivity than the Y-filter, so this Cy-filter and G-filter section is positioned over photosensitive cell arrays 12b and 12c, which have larger pixel electrode area. In this way it is possible to obtain image signals that have a uniform color level for the three primary colors.

In the variation shown in FIG. 9, conductive light shield film 80, which has openings 82 corresponding to the pixel electrodes, is formed on transparent protective layer 20. This structure is possible when the resistance of transparent electrode 18, which is shared by all the pixel electrodes, is only several hundred ohms. In this case, the liquid chemical used in the etching of the light shield film 80 during the patterning process is obstructed from progressing further by protective layer 20. Accordingly, transparent electrode 18, which is weak against this chemical is not damaged.

Although the present invention has been shown and described with reference to particular embodiments, various changes and modifications which are obvious to a person skilled in the art to which the invention pertains are deemed to lie within the scope of the invention.

Figure 10:
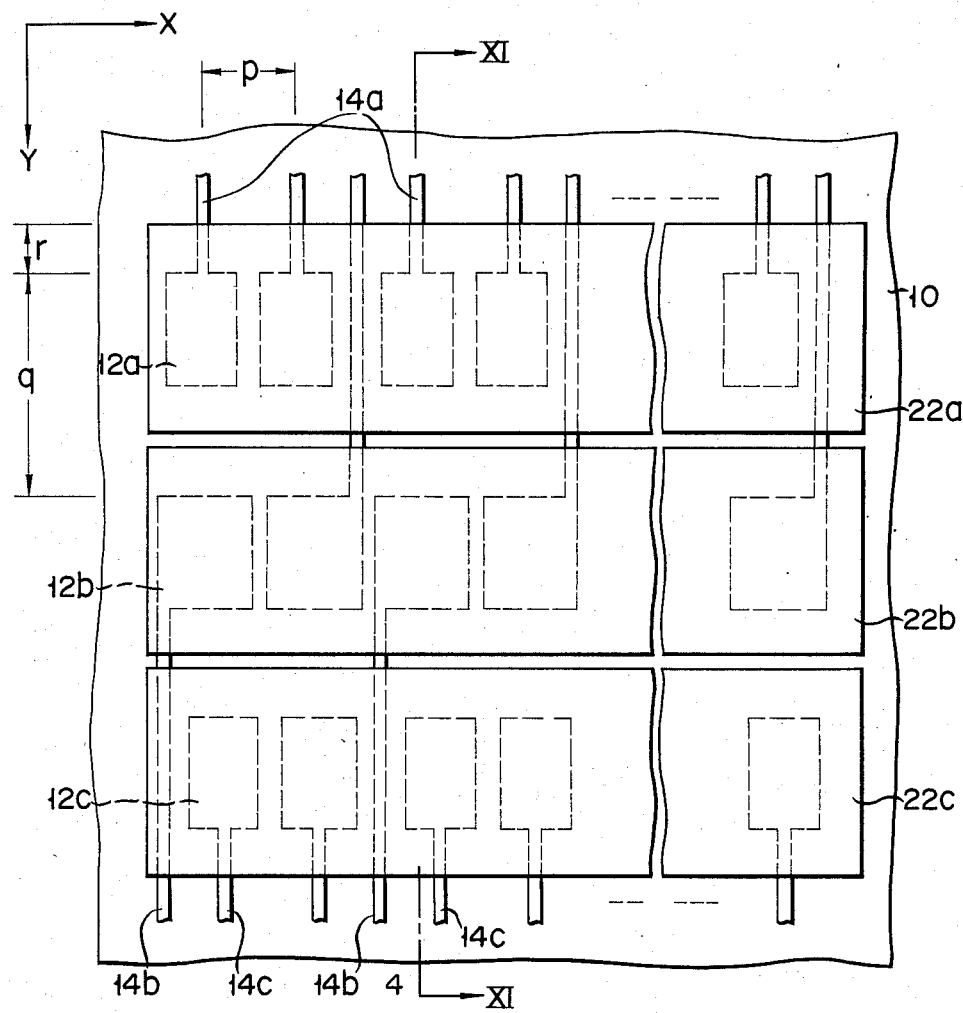
FIG. 10 is a plan view of the main parts of the sensor according to the third embodiment of the invention.
Figure 11:
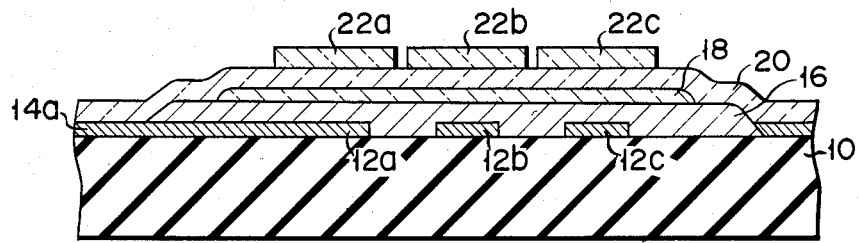
FIG. 11 is a cross section along the line XI—XI of the sensor of FIG. 10.

In the above embodiments, a color image sensor which separates light into four colors, including white was described. This invention is not, however, limited to this, and may be applied to a color image sensor which divides light into three colors. In the plan view of the contact type image sensor shown in FIG. 10, cell arrays 22a, 22b, 22c, which are respectively prescribed by the plurality of pixel electrodes arranged in the main scanning direction X, are formed on substrate 10 and, as shown in FIG. 11, R, G, B filters are arranged on top of them.

Signal output lines 14b of pixel electrodes 12b included in the photosensing cell array in the center are alternately spaced in the main scanning direction X and extend in opposite directions in the secondary scanning direction Y. With this kind of arrangement, signal output lines 14b pass through the gap between pixel electrodes 12a included in the outside photosensing cell arrays, and lead to the outside. Signal output lines 14b pass through the gaps of pixel electrodes 12c included in the other outside photosensing cell array, and lead outside. In this case, the planar size of the pixel electrodes 12a and 12c included in the two cell arrays on the outside is smaller than that of the epixel electrodes 12b included in the photosensing cell array in the center by size of the gap. With a contact type color image sensor having this kind of construction, the arrangement rule of pixel electrodes 12 on substrate 10 follow is in accordance with the idea of this invention. Accordingly, the same effect as in the other embodiments is obtained and a good reproduction of the color image signal of the document is possible.

What is claimed is:

1. A contact type color image sensor for reading out a document image at its actual size while moving in the lengthwise direction of the document, comprising:
   (a) a substrate;
   (b) a plurality of photosensitive cell arrays aligned at a predetermined first pitch on said substrate, each having n photosensitive cells (where n is a positive integer) aligned at a predetermined second pitch, said first pitch equalizing k times said second pitch (where k is larger than 1, and k×n is a natural number); and
   (c) filter means positioned over said photosensitive cell arrays, for receiving incident image light, filtering this light and radiating specific primary color light components onto said photosensitive cell arrays, whereby color signals of the primary colors necessary for reproduction of the color image of said document are output from the respective cell arrays.

2. The image sensor according to claim 1, wherein each of said cell arrays defines plural unit images and has one side which is substantially equal in length to the length of the unit image.

3. The image sensor according to claim 1, further comprising a plurality of signal delay means connected to said plurality of cell arrays, for delaying the signals to compensate for the read out time difference between the color signals output from said cell arrays.

4. The image sensor according to claim 3, further comprising analog-to-digital converter means, provided between said cell arrays and said signal delay means, for digitizing said color signals output from said plurality of cell arrays to generate digital color signals.

5. The image sensor according to claim 4, wherein said cell arrays are arranged as rows of photosensitive cells, and wherein said signal delay means includes:
   delay registers connected to second and subsequent rows of said cell arrays, for respectively delaying the digital color signal read out from said second and subsequent rows of cell arrays by time components corresponding to the read-out delays between the color signal read out from the first cell array and the color signals read out from the second and subsequent cell arrays, whereby the read-out timing of all the color signals from said cell arrays is made synchronous with each other.

6. The image sensor according to claim 5, wherein each signal delay occurring at said delay registers is increased by a factor of k.

7. The image sensor according to claim 1, further comprising pixel electrodes aligned in rows and columns on said substrate and defining the cells of said cell arrays; and a photoelectric converting layer formed of amorphous semiconductor material covering said pixel electrodes on said substrate.

8. The image sensor according to claim 7, wherein said substrate is formed of an insulative material.

9. The image sensor according to claim 8, further comprising a transparent conductive layer formed on said photoelectric converting layer and functioning as a common electrode for said pixel electrodes.

10. The image sensor according to claim 9, further comprising a plurality of signal delay means, connected to said plurality of cell arrays, for preforming a signal delay operation to compensate for the read-out time differences between the color signal output from said cell arrays.

11. The image sensor according to claim 10, further comprising analog-to-digital converter means provided between said cell arrays and said signal delay means, for digitizing said color signals output from said plurality of cell arrays.

12. The image sensor according to claim 11, wherein said cell arrays are arranged as rows of photosensitive cells, and wherein said signal delay means includes:
   delay registers connected to second and subsequent rows of said cell arrays, for respectively delaying the digital color signals read out from said second and subsequent rows of cell arrays by time components corresponding to the read-out delays between the color signal read out from the first cell array and the color signals read out from the second and subsequent cell arrays, whereby the read-out time of all the color signals from said cell arrays is made synchronous with each other.

13. The image sensor according to claim 12, wherein each signal delay occurring at said delay registers is increased by a factor of k.

* * * * *